United States Patent
Moriyama et al.

(10) Patent No.: US 6,916,544 B2
(45) Date of Patent: Jul. 12, 2005

(54) LAMINATE TYPE MATERIALS FOR FLEXIBLE CIRCUITS OR SIMILAR-TYPE ASSEMBLIES AND METHODS RELATING THERETO

(75) Inventors: Hideki Moriyama, Nagoya (JP); Kenji Uhara, Aich (JP); Meredith L. Dunbar, Canal, OH (US); James R. Edman, Circleville, OH (US)

(73) Assignees: E. I. du Pont de Nemours and Company, Wilmington, DE (US); DuPont Toray Co. Ltd., Tokyo (JP)

( * ) Notice: Subject to any disclaimer, the term of this patent is extended or adjusted under 35 U.S.C. 154(b) by 356 days.

(21) Appl. No.: 10/150,233

(22) Filed: May 17, 2002

(65) Prior Publication Data

US 2003/0215654 A1 Nov. 20, 2003

(51) Int. Cl.$^7$ .............................................. B32B 15/08
(52) U.S. Cl. ..................... 428/458; 428/473.5; 428/910
(58) Field of Search .............................. 428/910, 473.5, 428/458

(56) References Cited

U.S. PATENT DOCUMENTS

| | | | |
|---|---|---|---|
| 5,070,181 A | 12/1991 | Kawai et al. | |
| 5,122,563 A | 6/1992 | Kaminski et al. | |
| 5,268,446 A | 12/1993 | Tamai et al. | |
| 5,478,913 A | 12/1995 | Boyce et al. | |
| 5,502,157 A | 3/1996 | Chang et al. | |
| 5,700,562 A | * 12/1997 | Sugimoto et al. | 428/327 |
| 5,741,585 A | 4/1998 | Harris et al. | |
| 6,274,699 B1 | 8/2001 | Meador | |
| 6,303,744 B1 | 10/2001 | Meador et al. | |
| 6,605,366 B2 | * 8/2003 | Yamaguchi et al. | 428/473.5 |

\* cited by examiner

*Primary Examiner*—Monique R. Jackson

(57) ABSTRACT

A laminate having improved resistance to separation failure when incorporated into a flexible circuit structure. The laminate comprising a highly bondable polyimide and is preferably formed from a polyamic acid comprising a tetracarboxylic acid component, a diamine component, and 0.1 to 5.0 mole % of a dicarboxylic acid component, with respect to the tetracarboxylic acid component, and wherein the adhesive strength of the laminate is greater than 10 N/cm, and more preferably greater than 19 N/cm.

12 Claims, No Drawings

LAMINATE TYPE MATERIALS FOR FLEXIBLE CIRCUITS OR SIMILAR-TYPE ASSEMBLIES AND METHODS RELATING THERETO

FIELD OF THE INVENTION

The present invention relates generally to laminate structures useful for the manufacture of flexible circuits or the like. More specifically, the laminates of the present invention have improved structural integrity due (at least in part) to an improved polyimide crosslink chemistry.

BACKGROUND OF THE INVENTION

Broadly speaking, polyimides have excellent electrical insulation and heat resistance properties. Polyimide films are therefore often used in the manufacture of flexible circuits. In one type of flexible circuit configuration, a thin polyimide film is laminated (directly or indirectly) to a flexible metal layer, e.g., copper foil.

The present invention is applicable to (but not limited to) any of the three common processing methods for producing such polyimide-metal laminates: (1) interposing an adhesive (or similar-type bonding type) layer between the polyimide film and the metal foil; (2) applying the metal layer directly onto a polyimide film using metal vapor deposition, metal plating, and/or the like; and (3) coating a copper foil with a polyimide precursor (e.g., an amic acid varnish, solvent-soluble polyimide varnish or similar-type chemistry), followed by a processing step to convert the precursor to a polyimide (typically done by curing).

Such laminates can have failure problems, due to poor adhesion or bonding between the polyimide layer and the metal layer. Such unwanted separation can cause a complete failure of the flexible circuit.

U.S. Pat. Nos. 5,122,563, 5,268,446, 5,478,913, 5,502,157, 5,741,585, disclose a variety of end-capping agents which can be employed with polyimide chemistry. These end-capping agents are typically used to control the viscosity of the polyamic acid, or final molecular weight of the polyimide.

SUMMARY OF THE INVENTION

The present invention is directed to laminate-type structures having advantageous resistance to separation failure when incorporated into a flexible circuit type structure. The laminates of the present invention comprise a conductive substrate layer, optionally an adhesive layer, and a thin, at least partially oriented, wholly or partially cross-linked polyimide layer.

DETAILED DESCRIPTION OF THE PREFERRED EMBODIMENTS

In a first embodiment, a highly bondable polyimide layer is initially formed from a polyamic acid (or precursor or derivative thereof). The preferred polyamic acid can be represented by the general formula,

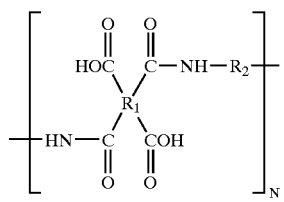

where $R_1$ and $R_2$ are any group containing 6 or more carbon atoms, where $R_1$ and $R_2$ can be different or the same, and where N represents any positive integer greater than twenty. The preferred polyamic acid is formed from a tetracarboxylic acid component, a dicarboxylic acid component, and a diamine component (or precursors or derivatives thereof). In an embodiment, the tetracarboxylic acid component can be either a tetracarboxylic acid represented by the general formula,

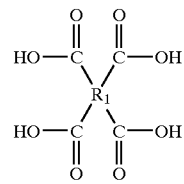

or a tetracarboxyilic acid dianhydride represented by the general formula.

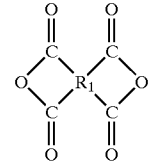

More preferably, $R_1$ in the tetracarboxylic acid component, is selected from the following and may be the same or different from each other,

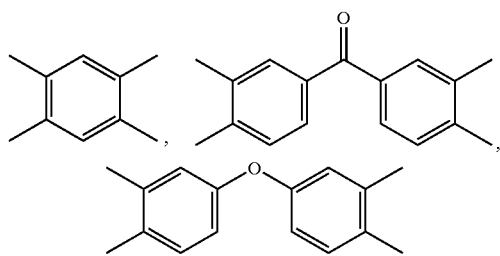

Most preferably, up to about 50, 60, 70, or 80 mole percent of the tetracarboxylic acid component includes $R_1$ selected from the following groups and may be different from each other,

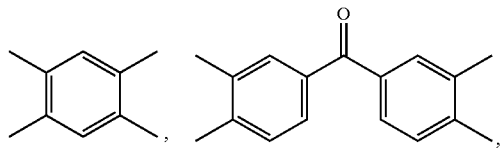

-continued

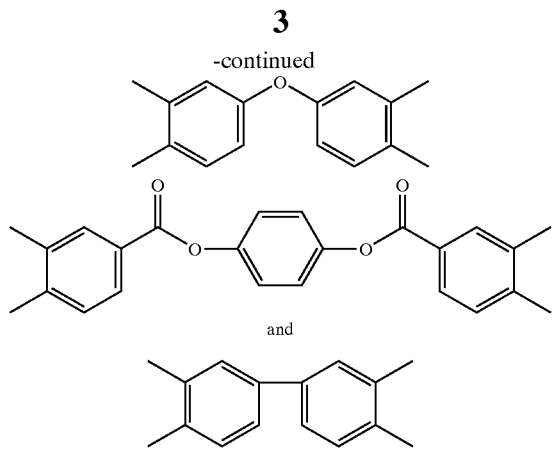

and and the remainder of the tetracarboxylic acid component includes $R_1$ selected from the groups,

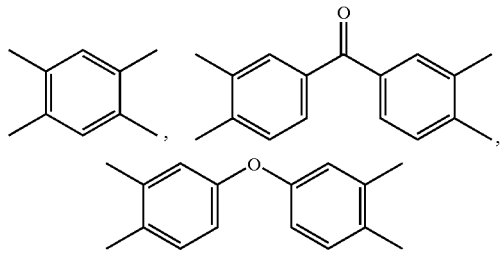

The highly bondable polyimides used to make the laminates of the present invention may be either a homopolymer polyimide or copolymer polyimide. A copolymer polyimide typically contains $R_1$ repeating units that are different from other $R_1$ units, or may contain $R_2$ repeating units that are different from other $R_2$ units, or both.

As used herein the term "dicarboxylic acid component" is a dicarboxylic acid or dicarboxylic acid mono-anhydride that contains at least one cross-linkable group. As used herein, the term "cross-linkable group" means a group that contains an unsaturated bond so that when the unsaturated bond is exposed to heat, it will then bond with other reactive sites in a polymer chain. Preferably, the cross-linkable group is a carbon—carbon double bond or a carbon to carbon triple bond. As used herein, the term "group" is intended to include the identified functional group or moiety but can additionally include other components linked to the functional group or moiety, covalently bonded or otherwise, particularly (but not exclusively) if the other components provide advantageous stability, instability or other influence upon the moiety or functional group.

Various types of dicarboxylic acid components or groups will generally work when preparing the preferred polyamic acids of the present invention. Examples include, but are not limited to, nadic anhydride, phenylethynyl phthalic anhydride (PEPA) and maleic anhydride. These dicarboxylic acid components can be represented by the formulas,

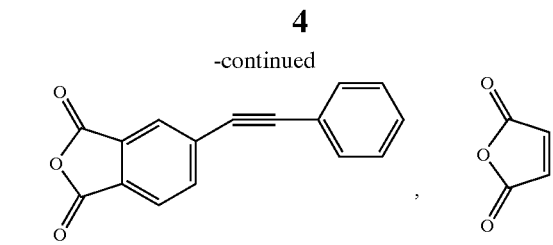

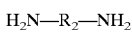

The diamine component can be represented by the general formula, $$H_2N-R_2-NH_2$$

In on embodiment, the diamine component, $R_2$ can be selected from the list consisting of:

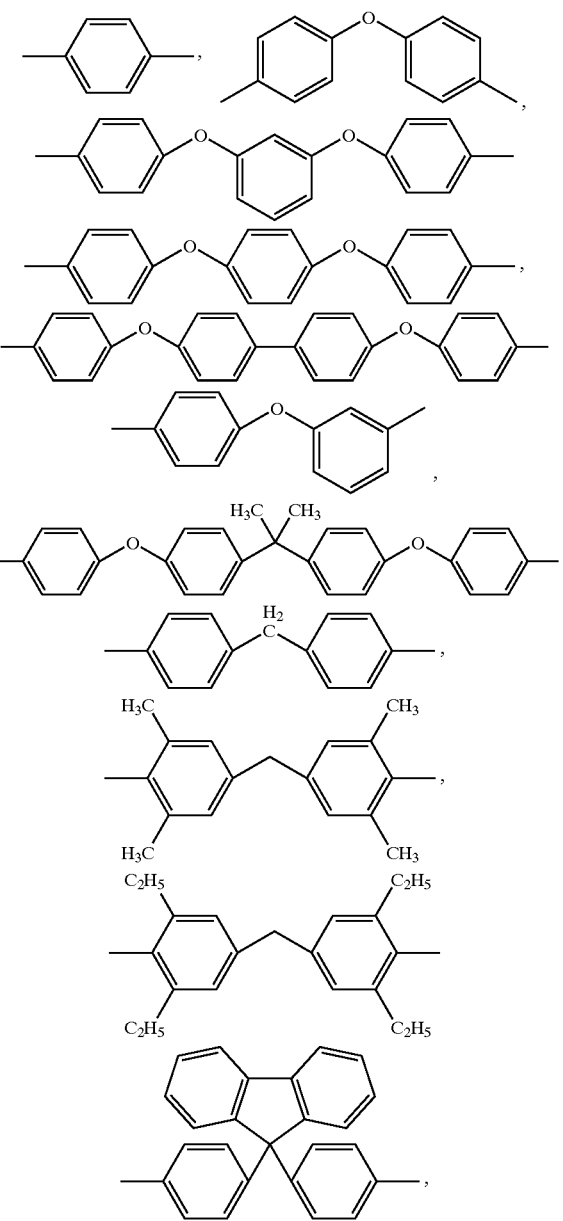

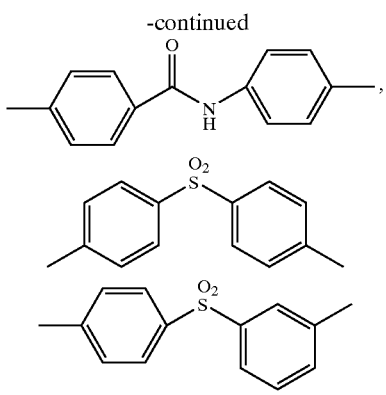

and may be the same or different from each other.

Generally, the sum of the moles of the tetracarboxylic acid groups and the dicarboxylic acid groups need not be equal to the moles of the diamine groups. To adjust molecular weight of the polymer, the molar ratio of the sum of the moles of tetracarboxylic acid group and dicarboxylic acid group to diamine group can often be adjusted from about 0.90, 0.92, 0.94, 0.96, 0.98, or 1.00 to about 1.00, 1.02, 1.04, 1.06, 1.08, or about 1.10. Moreover, it is generally not required that the tetracarboxylic acid groups be the same throughout the polymer, or that the diamine groups be the same throughout the polymer. Different tetracarboxylic acid groups may be chosen to form copolyamic acids or copolyimides. Likewise, different diamine groups may be chosen to form copolyamic acids and copolyimides. In one embodiment, $R_1$ and $R_2$ each include at least one aromatic group.

When forming the polyamic acid, about 0.1, 0.3, 0.5, 0.7, 0.9, 1.2, 1.4, 1.6, 1.8, 2.0, 2.2, 2.4, 2.6, 2.8, or about 3.0 to about 3.0, 3.2, 3.4, 3.6, 3.8, 4.0, 4.2, 4.4, 4.6, 4.8, or about 5.0 mole % of the dicarboxylic acid component, with respect to the tetracarboxylic acid component may be added to the diamine component. Next, the tetracarboxylic acid component can be added to the mixture of the diamine component and dicarboxylic acid component. The resulting solution can then be polymerized to form the polyamic acid of the present invention. In this embodiment, the ends of some of the polyamic acid chains will typically contain a dicarboxylic acid component containing at least one cross-linkable group.

Aprotic polar solvents are some of the typical solvents which can be used to dissolve the monomers when making the preferred polyamic acids and polyimides of the present invention. Examples of aprotic solvents include; sulfoxide solvents like dimethylsulfoxide and diethylsulfoxide; formamide solvents like N,N'-dimethylformamide and N,N'-diethylformamide; acetamide solvents like N,N'-dimethylacetamide and N,N'-diethylacetamide; pyrrolidone solvents like N-methyl-2-pyrrolidone and N-vinyl-2-pyrrolidone; and phenolic solvents like phenol, o-, m-, or p-cresol, xylenol, halogenated phenols, catechols; hexamethylphosphoramide, γ-butyrolactone, and the like. Aprotic solvents can be used singularly or in mixtures with other aromatic hydrocarbons such as xylene or toluene.

In one embodiment, the chemical conversion process involves emmersing the polyamic acid in (or otherwise mixed) with appropriate "polyamic acid conversion" chemicals or the like. Common polyamic acid conversion chemicals include tertiary amine imidizing catalysts and anhydride dehydrating agents.

A commonly used anhydride dehydrating agent is acetic anhydride or a derivative thereof. Often, acetic anhydride is used in molar excess as compared to the amount of amide acid groups in the polyamic acid. Typically about 2.0 to about 2.4 moles, per repeating unit of the polyamic acid, is used. Other operable lower fatty acid anhydrides can be used in place of acetic anhydride as the dehydrating agent. These lower fatty acids include propionic anhydride, butyric anhydride, valeric anhydride and mixtures thereof. These anhydride mixtures can also be combined with mixtures of aromatic monocarboxylic acids including benzoic acid, naphthoic acid, mixtures of carbonic and formic acids, or aliphatic ketenes.

In addition, a comparable amount of tertiary amine imidizing catalyst may often be used in the chemical conversion process. The tertiary amine is generally a catalyst to aid both drying and imidization of the polyimide. Preferred tertiary amine catalysts include pyridine and beta picoline. These materials are used in varying amounts, up to several moles per mole of anhydride dehydrating agent. Tertiary amines will generally have approximately the same activity level as pyridine; beta-picoline may also be used. Examples include, alpha-picoline; 3,4-lutidine; 3,5-lutidine; 4-methylpyridine; 4-isopropyl pyridine; N,N-dimethylbenzyl amine; isoquinoline; 4-benzyl pyridine, N,N-dimethyldodecyl amine and triethyl amine.

In the chemical conversion polyimide process, the polyamic acid of the present invention is typically cast as a viscous liquid onto a rigid support surface. The surface can be a metal drum or seamless metal belt. Once the polyamic acid is cast onto the support surface, it is heated in stages to produce a self-supporting "gel-film". If conversion chemicals are not added to the polyamic acid prior to casting, these chemicals may be coated onto the polyamic acid gel-film during or after casting. Next, the polyamic acid gel-film is typically stripped from the support surface and fed into a curing oven where full curing of the polyamic acid to a polyimide is generally performed under high temperature conditions. Here, the polyamic acid is imidized. In the curing oven the polyimide is also substantially dried of any remaining solvents, including water.

In a thermal conversion process the polyamic acid of the present invention (without polyamic acid conversion chemicals) is cast onto a rigid support surface and heated to form a so-called "green-film". The self-supporting green-film is stripped from the casting surface and fed through a curing oven for full or partial curing to a polyimide under high temperature processing. In the curing oven, the green-film is often heated to temperatures in excess of the imidization temperature of the polyimide so that typically the green-film is substantially dried of any remaining solvent and is fully imidized.

The polyimide of the present invention is typically in the form of a film. While not intending to be bound by any particular theory, the inventor believes that the polyimide of the present invention is cross-linked during the polyimide cure step. Typically, the polyimide cure step involves the use of a tentering oven, or tenter oven. It is believed that the cross-linkable groups of the dicarboxylic acid components break under the high heat of curing, and then bond in situ to other polyimide chains.

Polyimide films of the present invention can therefore be called "tenterable" and are thereby further distinguishable from polyimide composites which are not generally designed to be tenterable, and indeed, tenterability would generally be disadvantageous for most, if not all, polyimide composite compositions. In contrast to polyimide composites, the present invention is directed at least in part to problems with tenterable polyimide films for flexible circuitry. The polyimide films of the present invention can generally be bent, often up to about 30, 50, 70 or about 90 degrees for 30 seconds, without flexible circuitry failure due to undue embrittlement or observable stress cracks (i.e., stress cracking generally observable at a magnification of about 10×, 20×, 30×, 40×, 50×, 60×, 70×, 80×, 90×, 100×, or 1000×) and without the separation problems described above.

The highly bondable polyimide films of the present invention are generally not only mechanically superior to many earlier polyimides used in flexible circuit structures, but also have a more advantageous bond to the metal substrate layer due at least in part to the a higher adhesive strength relative to many earlier polyimides. Surprisingly, at relatively low levels of cross-linking of the polyimide, as discussed and described above, the resulting crosslink density will not unduly harm the tenterability (or curing) of the polyimide film, and will generally avoid any unwanted brittleness in the polyimide film.

Indeed in some embodiments, the processability of the polyimide film is improved. Furthermore, the laminates made from the highly bondable polyimides of the present invention, (particularly when ordinary skill and experimentation is used to optimize the polyimide crosslink chemistry, which typically will vary or otherwise depend upon the particular chemical system selected) the resulting film will often exhibit one or more of the following: i. improved dimensional stability in the flexible circuit laminate; ii. improved flatness; iii. higher modulus; and sustained flex life. All of these properties can be beneficial to flexible circuit manufacturers and can be important improvements over the earlier used, noncross-linked, polyimides.

The highly bondable polyimide film may be stretched or unstretched. Stretching may occur during the polyimide cure step, after the polyimide cure step (tentering), or during a post treatment step. Typically, stretching of a polyimide during curing, or tentering, is done both in the traverse direction (TD) of the film and the machine direction (MD) of the film. The machine direction of the film is the direction in which the film is processed. The traverse direction is the opposite direction, or the direction going across the processing machine. Examples typical amounts of TD stretch, or TD orientation range from about 0.5, 0.6, 0.7, 0.8, 0.9, or 1.0, to about 1.0, 1.1, 1.2, 1.3, 1.4, 1.5, 1.6, 1.7, 1.8, or 1.9 times the width of the gel-film or green-film. MD stretching can typically range from about 0.5, 0.6, 0.7, 0.8, 0.9, or about 1.0, to about 1.0, 1.1, 1.2, 1.3, 1.4, or about 1.5 times the length of the gel-film or green-film. In the cases where the film is stretched below 1.0 of its original length or width, the film will often experience TD and MD orientation, because the film loses mass, and thus size, during tentering (commonly referred to as "film shrinkage"). However when the film is restrained during shrinking (as typically happens), the film will be stretched, and thus oriented, in one or both directions, typically both directions.

It is permissible for the highly bondable polyimides to contain up to about 10, 20, 30, 35, 40, 45, or 50.0 wt. % filler, either inorganic, organic or mixtures thereof. Examples of inorganic fillers include carbon particles, metal oxide powders and the like. One example of organic filler is a second type of polymer that could be used to improve either the processability of the polyimide film or could be used to increase the usefulness of the polyimide in certain end-use applications.

The laminates of the present invention are used as flexible circuit structures. Common adhesives, such as an acrylic, epoxy or phenolic adhesive can be used to bond the highly bondable polyimide layer to the metal substrate layer. The highly bondable polyimide films are preferably from about 3, 5, 10, 20, 25, 30, 35, 40, 45, 50, 55, 60, 65, 70, 75, 80, 85, 90, 95, or 100 microns to about 100, 110, 120, 130, 140, 150, 160, 170, 180, 190, 200, 210, 220, 230, 240, or 250 microns thick. If the thickness of the polyimide layer is about 2 microns or less, laminates will generally have difficulty retaining flatness. If the thickness of the polyimide layer exceeds 250 microns, the laminates will often lack flexibility. Laminates that are too rigid are typically undesirable in the flexible circuit market.

The laminates of the present invention may be prepared using a variety of different methods. The highly bondable polyimide layer and the metal substrate layer may be adhered together via an adhesive layer, as mentioned above, or the metal substrate layer may be deposited directly onto the polyimide surface using vapor metal deposition. Another technique to form the laminate is to solution cast a polyamic acid directly onto an already existing metal substrate layer, usually a metal foil, and thereafter curing the polyamic acid to a polyimide to substantially remove all of the solvents and effect imidization of the polyimide layer.

As used herein the term "adhesive strength" represents the peeling strength (or peel strength) of the highly bondable polyimide from the metal substrate layer. The adhesive strength is measured according to JAPANESE INDUSTRIAL STANDARD (JIS) C50516-1994.

The laminates of the present invention may be manufacture by pressing the polyimide layer and metal layers together, particularly with heat and most particularly with heat and a heat activated adhesive layer between the metal layer and polyimide layer. For example, a pressure and/or heat activated acrylic adhesive sheet can be interposed between and used to bond the highly bondable polyimide layer to a copper foil. After bonding, the laminate can then peeled apart to determine the adhesive strength. This is the "peel strength" of the laminate, or as used herein, the adhesive strength.

In the case of using an acrylic adhesive to bond the polyimide to a freestanding copper foil, adhesive strength of the laminate has been observed to improve at least about 20% over conventional adhesive strengths (conventional adhesive strengths are typically in the range of about 15–18 N/cm), and improvements in excess of 50% were also observed. In other comparative laminates, where the initial adhesive strength was in the range of 2–4 N/cm, adhesive strengths were improved even more dramatically, from about 5×up to about 10×.

Broadly speaking, in metal-vapor deposition lamination processes, the first step typically is to form a thin layer of metal on the polyimide surface. This step is commonly called sputtering. During the sputtering step, metal is typically deposited onto the polyimide film's surface to a thickness of about 0.1 to 1.0 microns. After sputtering, a more substantial layer of metal is typically plated up to a thickness of about 1.0 to 20.0 microns. This process is known as metalization. There is no particular limitation as to which type of metal may be used. Examples of different types of metals used in a polyimide film metalization process are copper, aluminum, gold, silver, nickel, chromium, magnesium, zinc and alloys containing two or more of these metals. However, the present invention is not limited to these types of metal vapor deposition processes.

As taught and/or suggested in co-pending application Ser. No. 09/848,895, filed on May 4th, 2001, hereby incorporated into this specification by reference, (the co-pending application is also assigned to E. I. DuPont de Nemours & Co.

and involves overlapping inventorship), adhesive strength improvement due to crosslinking is improved, whether or not an acrylic adhesive is used, e.g., whether the metal layer and polyimide layer are bonded by metal vapor deposition or by use of an adhesive layer (see EXAMPLE 3 of application Ser. No. 09/848,895). Hence, the laminates of the present invention should show advantageous improvement, regardless of whether the polyimide layer is bonded directly to the metal (i.e., no adhesive layer between the polyimide layer and metal layer) or if bonded together with an adhesive layer (i.e., an adhesive layer between the polyimide layer and metal layer). Although the chemistry is different (between the co-pending application and the present specification), the fundamental mechanism for improved adhesion is similar and should provide similar results, regardless of the presence or absence of an adhesive layer.

EXAMPLES

The following examples illustrate certain features and advantages of the present invention. They are intended to be illustrative of the invention, but not limiting.

General Procedure

In these examples, sheets of the polyimide and 35 micron-thick copper (called BAC-13-T, a product of Japan Energy Company) were pressed together under heat to form laminates. An acrylic adhesive layer (Pyralux® LF-0100, a trademark of the DuPont Company) was placed between the polyimide sheet and copper. The lamination conditions were the same in all the examples, 60 minutes bonding time, a temperature of 356° F. (180° C.), and a pressure of 6400 psi (450 kg/cm$^2$). After bonding, the laminates were peeled according to Japanese Industrial Standard (JIS) C-50516-1994. The adhesive strengths are reported in the table below.

Example 1

19.43 g (97 millimoles) of a diamine component, 4,4'-diaminodiphenyl ether (4,4'-ODA), and 149.5 g of N,N'-dimethylacetamide (DMAc) were placed in a 500 ml separable flask equipped with a stirrer. The mixture was stirred at room temperature in a nitrogen atmosphere to form a solution. After 30 minutes of stirring, 0.241 g (0.97 millimoles) of a dicarboxylic acid component, phenylethynyl phthalic anhydride (PEPA), was added and the mixture was stirred. Over a period of 30 minutes to 1 hour, 20.53 g (94 millimoles) of a tetracarboxylic acid component, pyromellitic dianhydride (PMDA), was added in several portions. After 1 hour of stirring, 10.58 g of a 6 wt. % solution pyromellitic dianhydride (PMDA) in N,N'-dimethylacetamide (DMAC) was added drop wise over 30 minutes. The mixture was stirred for an additional hour. The resultant polyamic acid had a viscosity of 270 Pa·s.

A portion of the resultant polyamic acid was placed on polyester film to generate a uniform film using a spin coater. It was then heated for 1 hour at 212° F. (100° C.) to give a self-supporting polyamic acid green-film. The green-film was then heat treated for 20 minutes at 5720° F. (300° C.), and then 5 minutes at 860° F. (460° C.), to obtain a polyimide film. The film was laminated to copper using the aforementioned acrylic adhesive for 60 minutes bonding time, at a temperature of 356° F. (180° C.), and at a pressure of 6400 psi (450 kg/cm$^2$). After bonding, the laminate was peeled according Japanese Industrial Standard (JIS) C-50516-1994. The adhesive strength of the resultant film was measured and is shown in Table 1.

Example 2

19.43 g (97 millimoles) of diamine component, 4,4'-diaminodiphenyl ether, and 149.5 g of N,N'-dimethylacetamide (DMAc) was placed in a 500 ml separable flask equipped with a stirrer and stirred at room temperature under a nitrogen atmosphere. After a 30 minute stirring, two dicarboxylic acid components, 0.12 g (0.48 millimoles) of phenylethynyl phthalic anhydride (PEPA) and 0.08 g (0.49 millimoles) nadic anhydride (5-norbornene-2,3-dicarboxylic anhydride) were added and stirred. After 1 hour of stirring, 20.53 g (94 millimoles) of a tetracarboxylic acid component, pyromellitic dianhydride (PMDA), was added in several portions. After another 1 hour of stirring, 10.58 g of a 6 wt. % pyromellitic dianhydride in N,N'-dimethylacetamide solution was added drop wise over 30 minutes. The mixture was stirred for an additional hour. The resultant polyamic acid had a viscosity of 250 Pa·s.

According to paragraph 2 of EXAMPLE 1, the polyimide film was generated and the adhesive strength of the laminate was measured. The results are shown in Table 1 below.

Example 3

In accordance with EXAMPLE 2 another polyamic acid composition was formed. However, with respect to the dicarboxylic acid component, 0.095 g (0.97 millimoles) of maleic anhydride was substituted for the PEPA and the nadic acid mono-anhydride of EXAMPLE 2. The diamine component and tetracarboxylic acid component remained the same. The resultant polyamic acid had a viscosity of 220 Pa·s.

According to paragraph 2 in EXAMPLE 1 a polyimide film was generated and the adhesive strength of the film was measured. The results are shown in Table 1 below.

Example 4

1.85 g (17 millimoles) of a diamine component, paraphenylenediamine (PPD), and 149.7 g of N,N'-dimethylacetamide (DMAc) was placed in a 500 ml separable flask equipped with a stirrer and stirred at 40° C. in a nitrogen atmosphere. After 30 minutes of stirring, 3.69 g (17 millimoles) of a tetracarboxylic acid component, pyromellitic dianhydride (PMDA), was added in several portions. After another 30 minutes of stirring, 15.58 g (78 millimoles) of a diamine component, 4,4'-diaminodiphenyl ether (4,4'-ODA) was added and the mixture stirred for 30 minutes.

Next, 0.08 g (0.49 millimoles) of a dicarboxylic acid component, nadic anhydride (5-norbornene-2,3-dicarboxylic anhydride), was added and the mixture stirred for an additional 30 minutes. Finally, 9.55 g (32 millimoles) of a tetracarboxylic acid component, 3,3',4,4'-biphenyltetracarboxylic dianhydride (BPDA), was added in several portions and the mixture stirred.

Over a period of 30 minutes to 1 hour, 9.31 g (43 millimoles) of a second tetracarboxylic acid component, pyromellitic dianhydride (PMDA), was added in several portions. After 1 hour stirring, 10.3 g of a 6 wt. % solution of pyromellitic dianhydride (PMDA) in N,N'-dimethylacetamide (DMAc) was added drop wise over 30 minutes and the mixture stirred for another hour. The resultant polyamic acid had a viscosity of 240 Pa·s.

A portion of the resultant polyamic acid was placed on polyester film to generate a uniform film using a spin coater. The film was heated for 1 hour at 100° C. to give a self-supporting polyamic acid green-film. The green-film was then heat treated for 20 minutes at 300° C. and 5 minutes at 460° C. to obtain a polyimide film. The adhesive strength of the resultant laminate was measured and is shown in Table 1.

Example 5

In accordance with EXAMPLE 4 a polyimide film was made except 0.16 g (1.0 millimoles) of a dicarboxylic acid component, nadic anhydride (5-norbornene-2,3-dicarboxylic anhydride), was added to the mixture instead of 0.49 millimoles. The resultant polyamic acid had a viscosity of 250 Pa·s.

A polyimide film was generated and the adhesive strength of the laminate was measured. The results are shown in Table 1.

Example 6

A portion of the same polyamic acid from Example 5 was placed on polyester film to generate a uniform film using a spin coater. This was then soaked in 200 grams of beta-picoline and 200 grams of acetic anhydride to give a self-supporting polyamic acid gel-film. The gel-film was heat treated for 30 minutes at 200° C., then 20 for minutes at 300° C. and finally 5 minutes at 460° C. to obtain a polyimide film. The adhesive strength of the resultant laminate was measured and is shown in Table 1.

Comparative Example A

This example is the same as EXAMPLE 1 except the dicarboxylic acid component was removed. In a 500 ml separable flask with a stirrer, 29.15 g (146 millimoles) of a diamine component, 4,4'-diaminodiphenyl ether (4,4' ODA), and 224 g of N,N'-dimethylacetamide were placed and stirred at room temperature under a nitrogen atmosphere. After 20 minutes to 1 hour, 30.80 g (141 millimoles) of a tetracarboxylic acid component, pyromellitic dianhydride (PMDA), was added in several portions. After 1 hour of additional stirring, 15.87 g of a 6 wt. % pyromellitic dianhydride (PMDA) in N,N'-dimethyl-acetamide (DMAC) was added over 30 minutes. The addition of the PMDA solution was followed by more stirring for an additional hour. The resultant polyamic acid had a viscosity of 240 Pa·s. A portion of the resultant polyamic acid was placed on a polyester film to generate a uniform film using a spin coater. It was then heated for 1 hour at 212° F. (100° C.) to give a self-supporting polyamic acid green-film. The green-film was heat treated for 20 minutes at 572° F. (300° C.), and then 5 minutes at 860° F. (460° C.), to obtain a polyimide film. The film was laminated, with heat and pressure, to copper foil (Japan Energy Company, BAC-13-T) using an acrylic adhesive layer in the form of a film, Pyralux® LF-0100 (a trademark of the DuPont Company). Lamination took place at 180° C. and 450 kg/cm² pressure for 60 minutes. The peel strength of the laminate was measured according to JIS C-5016-1994. The results are summarized in Table 1.

Comparative Example B

This example is the same as EXAMPLE 4 except the dicarboxylic acid component was removed. 1.85 g (17 millimoles) of a diamine component, paraphenylenediamine (PPD), and 149.7 g of N,N'-dimethylacetamide (DMAC) were placed in a 500 ml separable flask equipped with a stirrer. The mixture was stirred at 40° C. in a nitrogen atmosphere. After a 30 minutes of stirring, 3.69 g (17 millimoles) of a tetracarboxylic acid component, pyromellitic dianhydride (PMDA), was added in several portions. After another 30 minutes of stirring, 15.58 g (78 millimoles) of a diamine component, 4,4'-diaminodiphenyl ether (ODA), was added followed by 30 additional minutes of stirring. Then, 9.55 g (32 millimoles) of a tetracarboxylic acid component, 3,3',4,4'-biphenyltetracarboxylic dianhydride (BPDA), was added in several portions and the mixture was stirred.

Over a period of 30 minutes to 1 hour, 9.31 g (43 millimoles) of a tetracarboxylic acid component, pyromellitic dianhydride (PMDA), was added in several portions. After 1 hour stirring, 10.3 g of a 6 wt. % solution of pyromellitic dianhydride (PMDA) in N,N'-dimethylacetamide (DMAc) was added dropwise over 30 minutes. The mixture was further stirred for 1 hour. The resultant polyamic acid had a viscosity of 220 Pa·s.

A portion of the resultant polyamic acid was placed on polyester film to generate a uniform film using a spin coater. The film was then heated for 1 hour at 100° C. to give a self-supporting polyamic acid green-film. The self-supporting green-film was heated for 20 minutes at 300° C. and then for 5 minutes at 460° C. to obtain a polyimide film. A metal laminate was formed as in Comparative Example A. The adhesive strength of the resultant laminate was measured and is shown in Table 1.

Comparative Example C

This example is the same as EXAMPLE 6 except the dicarboxylic acid component was removed. A portion of the polyamic acid from Comparative Example B was placed on polyester film to generate a uniform film using a spin coater. The film was then soaked in 200 grams of beta-picoline and 200 grams of acetic anhydride to give a self-supporting polyamic acid gel-film. The gel-film was heated for 30 minutes at 200° C., then 20 minutes at 300° C., and then 5 minutes at 460° C. to obtain a polyimide film. A metal laminate was formed as in Comparative Examples A and B. The adhesive strength of the resultant laminate was measured and is shown in Table 1.

TABLE 1

Side A is an arbitrary side and Side B is the other side.

| Film Property | Side | Units | Example 1 | Example 2 | Example 3 | Example 4 |
|---|---|---|---|---|---|---|
| Adhesive strength | Side A | [N/cm] | 21.3 | 21.7 | 22.6 | 23.9 |
| Adhesive strength | Side B | [N/cm] | 19.6 | 21.3 | 21.3 | 22.3 |
| Film Thickness | | Microns | 55 | 50 | 50 | 50 |

| Film Property | Side | Units | Example 5 | Example 6 |
|---|---|---|---|---|
| Adhesive strength | Side A | [N/cm] | 23.2 | 23.2 |
| Adhesive strength | Side B | [N/cm] | 21.6 | 23.1 |
| Film Thickness | | Microns | 50 | 50 |

| Film Property | Side | Units | Comp. Example A | Comp. Example B | Comp. Example C |
|---|---|---|---|---|---|
| Adhesive strength | Side A | [N/cm] | 18.1 | 4.51 | 4.02 |
| Adhesive strength | Side B | [N/cm] | 15 | 2.11 | 1.91 |
| Film Thickness | | Microns | 60 | 50 | 50 |

What is claimed is:

1. A laminate composition comprising:
  (a) a conductive substrate layer;
  (b) optionally, an adhesive layer;
  (c) a thin, tenterable polyimide layer created at least in part by reaction of at least the following components:

(1) a tetracarboxylic acid component selected from the group consisting of a tetracarboxylic acid of the general structure

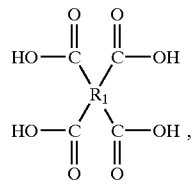

a tetracarboxylic acid dianhydride having the general structure

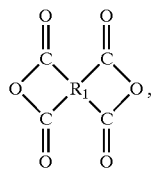

and combinations thereof;
(2) a dicarboxylic acid component selected from the group consisting of a dicarboxylic acid, a dicarboxylic acid monoanhydride and combinations thereof, said dicarboxylic acid component including at least one cross-linkable group; and
(3) a diamine component having the general structure $H_2N-R_2-NH_2$ wherein $R_1$ and $R_2$ are divalent organic groups which may be the same or different from each other, and which each of $R_1$ and $R_2$ have at least six carbon atoms; said dicarboxylic acid component (2) being present in an amount from about 0.1 to about 5.0 mole percent with respect to the tetracarboxylic acid component (1); and the ratio of the sum of the moles of the tetracarboxylic acid component (1) and the dicarboxylic acid component (2) to the moles of the diamine component (3) being from about 0.90 to about 1.10; and
wherein said laminate exhibits a peel strength of at least 10 N/cm pursuant to Japanese Industrial Standard (JIS) C-50516-1994.

2. A laminate according to claim 1 wherein at least a portion of the conductive layer is a metal, the thickness of the polyimide layer is in the range of from about 3 to 250 microns, the polyimide layer is oriented in at least one direction and is at least partially cross-linked, and wherein the peel strength is at least about 19N/cm.

3. A laminate according to claim 2 wherein components (2) and (3) of said polyimide layer are reacted before further reaction with component (1) and the conductive layer comprises, at least in part, copper or copper alloy.

4. A laminate according to claim 2 wherein the cross-linkable group of said polyimide layer includes an organic group selected from the group consisting of a carbon to carbon double bond and a carbon to carbon triple bond and the polyimide layer is oriented in both a machine direction ("MD") and in a traverse direction ("TD").

5. A laminate accordance with claim 1 wherein component (2) of said polyimide layer is selected from the group consisting of

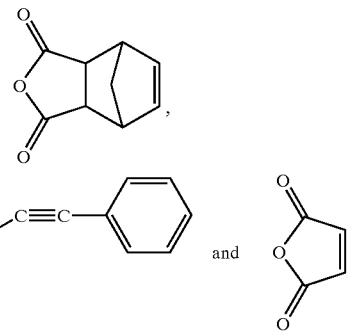

wherein the polyimide layer has an MD orientation of greater than 1.1 and a TD orientation greater than 1.1.

6. A laminate accordance with claim 2 wherein $R_1$ and $R_2$ of said polyimide layer each include at least one aromatic group and the polyimide layer has an MD orientation that is greater than the polyimide layer TD orientation.

7. A laminate accordance with claim 5 wherein $R_1$ of said polyimide layer is selected from the group consisting of

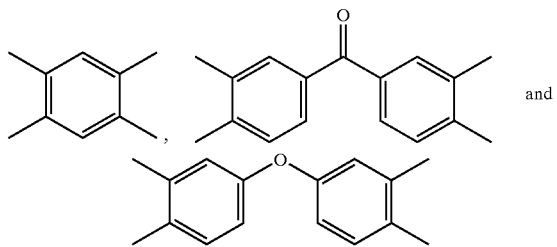

and $R_2$ of said polyimide layer is selected from the group consisting of

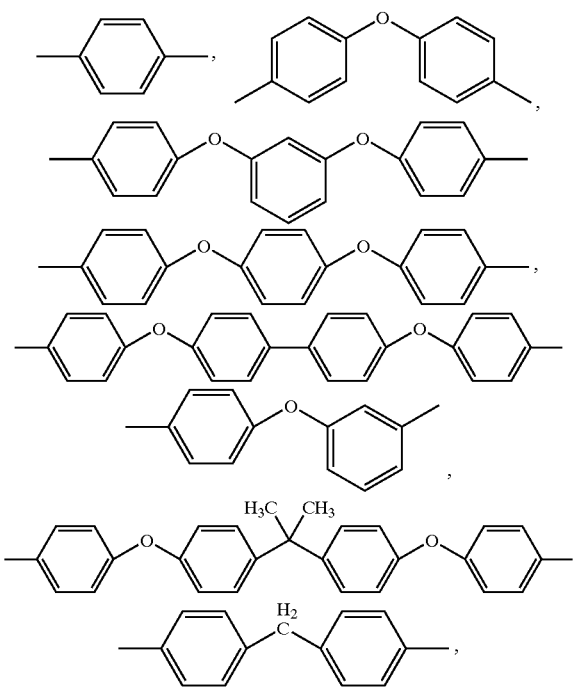

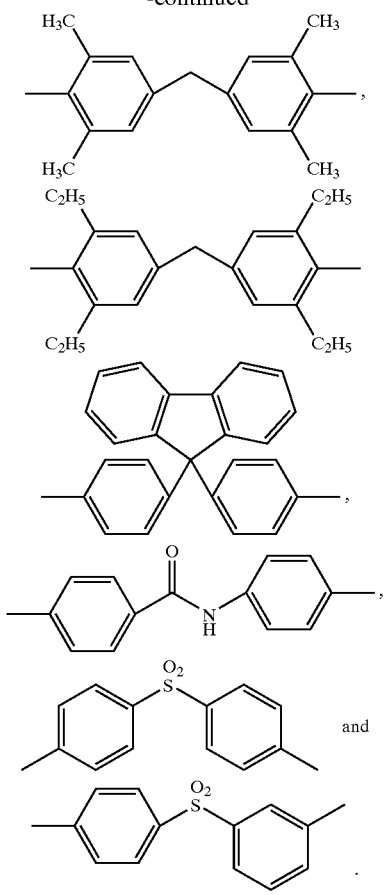
8. A laminate accordance with claim 5 wherein up to 80 mole percent of said tetracarboxylic acid component (1) includes $R_1$ selected from the group consisting of
the remainder of said carboxylic acid component (1) includes $R_1$ selected from the group consisting of
and $R_2$ is selected from the group consisting of
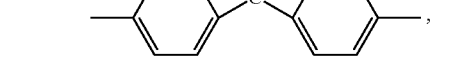

-continued

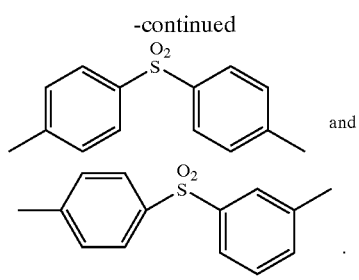 and .

9. A laminate in accordance with claim 1, wherein the laminate is free of any observable stress cracks after bending 90 degrees for 30 seconds, even at a magnification of 100×.

10. A laminate according to claim 1, wherein the polyimide layer is oriented in at least one direction and heat set at least in part by chemical cross-linking.

11. A laminate in accordance with claims 1, 2, 3, 4, 5, 6, 7, 8, 9, or 10, wherein the polyimide layer is devoid of an adhesive layer, and the polyimide layer is bonded directly to the conductive layer.

12. A laminate in accordance with claims 1, 2, 3, 4, 5, 6, 7, 8, 9, or 10, wherein the polyimide layer is bonded at least in part to the conductive layer by an adhesive layer.

* * * * *

UNITED STATES PATENT AND TRADEMARK OFFICE
CERTIFICATE OF CORRECTION

PATENT NO. : 6,916,544 B2
DATED : July 12, 2005
INVENTOR(S) : Meredith L. Dunbar et al.

It is certified that error appears in the above-identified patent and that said Letters Patent is hereby corrected as shown below:

Column 9,
Line 55, the number "5720° F" should read -- 572° F --.

Column 15,
Line 66, "carboxylic" should read -- tetracarboxylic --.

Signed and Sealed this

Fifteenth Day of November, 2005

JON W. DUDAS
*Director of the United States Patent and Trademark Office*